(12) United States Patent
Rode et al.

(10) Patent No.: US 9,234,119 B2
(45) Date of Patent: Jan. 12, 2016

(54) SOLAR CELLS WITH A BARRIER LAYER BASED ON POLYSILAZANE

(75) Inventors: Klaus Rode, Wiesbaden (DE); Sandra Stojanovic, Gersthofen (DE); Jan Schniebs, Berlin (DE); Christian Kaufmann, Berlin (DE); Hans-Werner Schock, Stuttgart (DE)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 1144 days.

(21) Appl. No.: 13/257,037

(22) PCT Filed: Mar. 16, 2010

(86) PCT No.: PCT/EP2010/001638
§ 371 (c)(1),
(2), (4) Date: Sep. 16, 2011

(87) PCT Pub. No.: WO2010/105798
PCT Pub. Date: Sep. 23, 2010

(65) Prior Publication Data
US 2012/0006403 A1    Jan. 12, 2012

(30) Foreign Application Priority Data

Mar. 19, 2009   (DE) .................. 10 2009 013 903

(51) Int. Cl.
| | |
|---|---|
| *C09D 183/16* | (2006.01) |
| *C08G 77/62* | (2006.01) |
| *H01L 31/0392* | (2006.01) |
| *H01L 31/0749* | (2012.01) |

(52) U.S. Cl.
CPC ............. *C09D 183/16* (2013.01); *C08G 77/62* (2013.01); *H01L 31/03923* (2013.01); *H01L 31/0749* (2013.01); *Y02E 10/541* (2013.01)

(58) Field of Classification Search
USPC ................. 428/429, 447; 427/508, 515, 553
See application file for complete search history.

(56) References Cited

U.S. PATENT DOCUMENTS

| | | | |
|---|---|---|---|
| 4,751,191 A | 6/1988 | Gonsiorawski et al. | |
| 6,501,014 B1 * | 12/2002 | Kubota et al. ................. | 136/256 |
| 7,067,069 B2 | 6/2006 | Shiho et al. | |
| 7,396,563 B2 | 7/2008 | Scarlete et al. | |
| 8,309,228 B2 * | 11/2012 | Dierdorf et al. ............. | 428/451 |
| 8,563,129 B2 * | 10/2013 | Rode et al. .................... | 428/336 |

(Continued)

FOREIGN PATENT DOCUMENTS

| | | | | |
|---|---|---|---|---|
| DE | 102 59 472 A1 | 9/2004 | | |
| DE | 10259472 A1 * | 9/2004 | ......... | H01L 31/0392 |

(Continued)

OTHER PUBLICATIONS

International Search Report (Form PCT/ISA/210) for PCT/EP2010/001636, which corresponds to U.S. Appl. No. 13/257,044.

(Continued)

*Primary Examiner* — Telly Green
(74) *Attorney, Agent, or Firm* — Mitchell Brustein

(57) ABSTRACT

The invention relates to a thin-film solar cell (10) comprising a substrate (1) of metal or glass, a dielectric barrier layer (2) based on a polysilazane and a photovoltaic layer structure (4) of the copper-indium sulphide (CIS) type or the copper-indium selenide (CIGSe) type.

19 Claims, 2 Drawing Sheets

(56) References Cited

U.S. PATENT DOCUMENTS

| | | | |
|---|---|---|---|
| 2003/0099843 A1 | 5/2003 | Aoki et al. | |
| 2003/0230338 A1 | 12/2003 | Menezes | |
| 2007/0196672 A1* | 8/2007 | Brand et al. | 428/447 |
| 2009/0101205 A1 | 4/2009 | Venderbosch et al. | |
| 2009/0258237 A1 | 10/2009 | Choi et al. | |
| 2010/0166977 A1 | 7/2010 | Brand et al. | |
| 2012/0017985 A1 | 1/2012 | Rode et al. | |

FOREIGN PATENT DOCUMENTS

| | | |
|---|---|---|
| DE | 10 2005 034 817 A1 | 2/2007 |
| JP | 2005-33063 A | 2/2005 |
| WO | WO 2007/107485 A1 | 9/2007 |

OTHER PUBLICATIONS

Restriction Requirement notification date Jun. 9, 2014 for U.S. Appl. No. 13/257,044.

Luiz Prager et al., "Conversion of Perhydropoysilazane into a $SiO_x$ Network Triggered by Vacuum Ultraviolet Irradiation: Access to Flexible, Transparent Barrier Coatings", Chem. Eur. J. vol. 13, pp. 8522-pp. 8529 (2007).

Office Action notification date Nov. 17, 2014 for U.S. Appl. No. 13/257,044.

English Translation from EPO of DE 102 59 472 A1.

Final Office Action notification date Mar. 31, 2015 for U.S. Appl. No. 13/257,044.

* cited by examiner

SOLAR CELLS WITH A BARRIER LAYER BASED ON POLYSILAZANE

The present invention relates to a chalcopyrite solar cell comprising a substrate, a photovoltaic layer structure and an intermediate dielectric barrier layer. The dielectric barrier layer arranged between the substrate and the photovoltaic layer structure is electrically insulating, and shields the photovoltaic layer structure from extraneous atoms which diffuse out of the substrate and can impair the efficiency of the solar cell. The solar cells of the present invention are especially thin-film solar cells with a photovoltaic layer structure of the copper indium sulfide (CIS) or copper indium gallium selenide (CIGSe) type.

The invention further relates to a process for producing solar cells based on chalcopyrite. In the course of the process, a barrier layer with a thickness in the range from 100 to 3000 nm is obtained by hardening a solution of polysilazanes and additives at a temperature in the range from 20 to 1000° C., especially 80 to 200° C.

In view of the scarcity of fossil resources, photovoltaics are gaining great significance as a renewable and environmentally sound energy source. Solar cells convert sunlight to electric current. Crystalline or amorphous silicon is the predominant light-absorbing semiconductive material used in solar cells. The use of silicon is associated with considerable costs. In comparison, thin-film solar cells with an absorber composed of a chalcopyrite material, such as copper indium sulfide (CIS) or copper indium gallium selenide (CIGSe), can be produced with significantly lower costs.

It is a very general requirement for rapid widening of photovoltaic use to improve the cost-benefit ratio of photovoltaic energy generation. For this purpose, it is desirable firstly to increase the efficiency of solar cells, and secondly to lower the production costs.

By monolithic interconnection, the efficiency of chalcopyrite solar modules can be increased. A solar module with monolithic interconnection consists of a multitude of separate solar cells which are arranged alongside one another on the substrate and are electrically connected to one another in series. For the purpose of monolithic interconnection, firstly the rear contact and secondly the photovoltaic layer structure are divided according to a predefined pattern—generally in the form of stripes. The structuring of the rear contact—known as the P1 section—requires an electrically insulating substrate. The P1 section is preferably undertaken by evaporating the rear contact along defined separation lines by means of a focused laser beam.

The carrier materials used for chalcopyrite solar cells are glass or substrate foils composed of metal or polyimide. In this context, glass is found to be advantageous since it is electrically insulating, has a smooth surface and, during the production of the chalcopyrite absorber layer, provides sodium which diffuses out of the glass into the absorber layer and, as a dopant, improves the properties of the absorber layer. Disadvantages of glass are its high weight and lack of flexibility. More particularly, glass substrates, owing to their stiffness, cannot be coated in inexpensive roll-to-roll processes.

A further disadvantage of glass is that, even in the later use of the solar cell, sodium still diffuses into the chalcopyrite absorber layer, and the concentration accumulated over a prolonged period can attain a value at which the chalcopyrite absorber layer is damaged—inter alia as a result of advanced crystal growth.

Foil-type substrates composed of metal or plastic are lighter than glass and in particular are flexible, such that they are suitable for the production of solar cells by means of an inexpensive roll-to-roll process. However, metal or polymer foils, according to their properties, can adversely affect the property of the chalcopyrite layer composite, and additionally do not possess a sodium depot for absorber doping. Owing to the elevated temperatures (in some cases >500° C.) to which the substrate is exposed during the production of the chalcopyrite solar cells, preference is given to using metal foils composed of steel or titanium.

For the purpose of monolithic interconnection of solar cells on titanium or steel substrates, an electrically insulating layer has to be introduced between the substrate and the photovoltaic absorber. The insulating layer should additionally act as a diffusion barrier in order to prevent the diffusion of metal ions out of the substrate, which can damage the absorber layer. For example, iron atoms diffusing out of steel can increase the recombination rate of charge carriers (electrons and holes) in chalcopyrite absorber layers, which decreases the photocurrent.

In numerous silicon-based electronic components and solar cells composed of amorphous or microcrystalline silicon, silicon oxide ($SiO_x$) is used as the material for insulating or dielectric layers. Such $SiO_x$ layers are deposited from the vaporous or liquid phase on a substrate such as a silicon wafer. The deposition is effected preferably by means of CVD, microwave plasma-enhanced CVD (MWPECVD), PVD (magnetron sputtering) or a sol-gel process.

Owing to the complex vacuum apparatus, CVD and PVD processes are associated with high costs, and the $SiO_x$ layers obtained have a low adhesion and low mechanical strength on some substrate materials, especially on metals. In addition, gas phase deposition entails the use of inflammable and/or toxic gases such as $SiH_4$, $CH_4$, $H_2$, $NH_3$, $SiO_x$ layers produced by means of sol-gel processes also have a low adhesion on metallic substrates. In addition, the lifetime of sol-gel materials is so short that characteristic material properties can change considerably even in the course of brief storage, and the quality of the layers thus produced varies greatly.

The prior art further discloses $SiO_x$ layers which are obtained from polysilazane and are used in solar cells for the purpose of passivation or for encapsulation.

For instance, U.S. Pat. No. 7,396,563 discloses the deposition of dielectric and passivating polysilazane layers by means of PA-CVD, using polysilanes as CVD precursors.

U.S. Pat. No. 4,751,191 teaches the deposition of polysilazane layers for solar cells by means of PA-CVD. The resulting polysilazane layer is structured photo-lithographically and serves for masking of metallic contacts and as an anti-reflection layer.

In view of the prior art, the present invention has for its object to provide chalcopyrite solar cells with a dielectric barrier layer which consists essentially of $SiO_x$, and an inexpensive process for production thereof. More particularly, the inventive barrier layer should have a high diffusion barrier action and ensure electrical insulation in conjunction with good adhesion on glass or flexible substrates composed of metal or plastic, and have a low density of defects such as holes and cracks.

This object is achieved by a chalcopyrite solar cell comprising a substrate, a photovoltaic layer structure and an intermediate dielectric barrier layer based on polysilazane.

BRIEF DESCRIPTION OF THE DRAWINGS

The invention is illustrated in detail hereinafter with reference to a figure. FIG. 1 shows a perspective view of a section through an inventive solar cell 10 comprising a substrate 1, a barrier layer 2 and a photovoltaic layer structure 4. The solar cell 10 is preferably configured as a thin-film solar cell and has a photovoltaic layer structure 4 of the copper indium sulfide (CIS) or copper indium gallium selenide (CIGSe) type.

Figure 1:
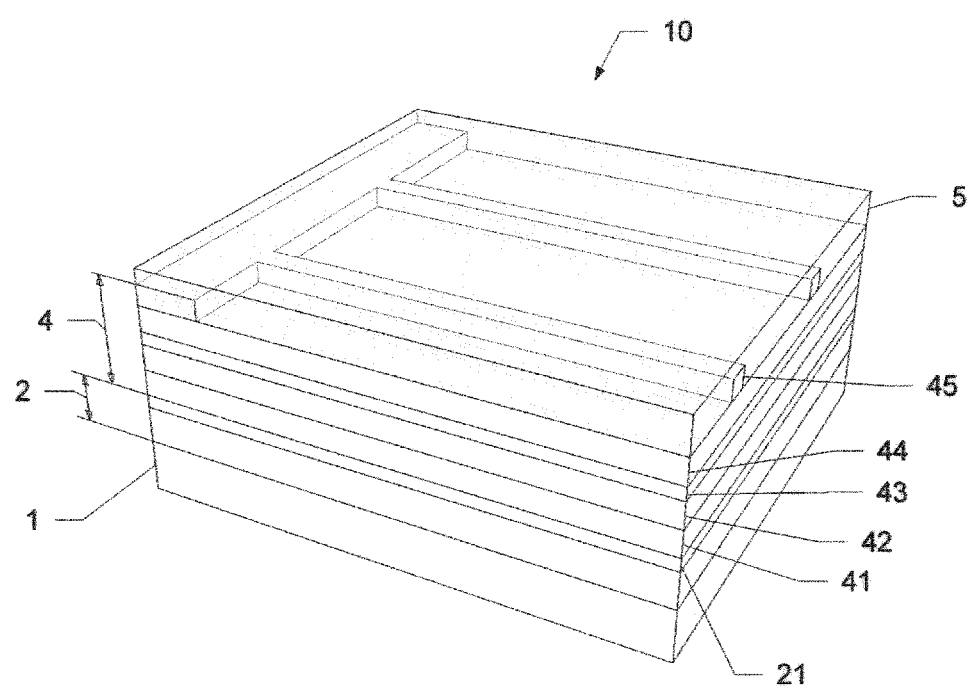
FIG. 1 depicts a perspective view of a section through an inventive solar cell.
Figure 2:
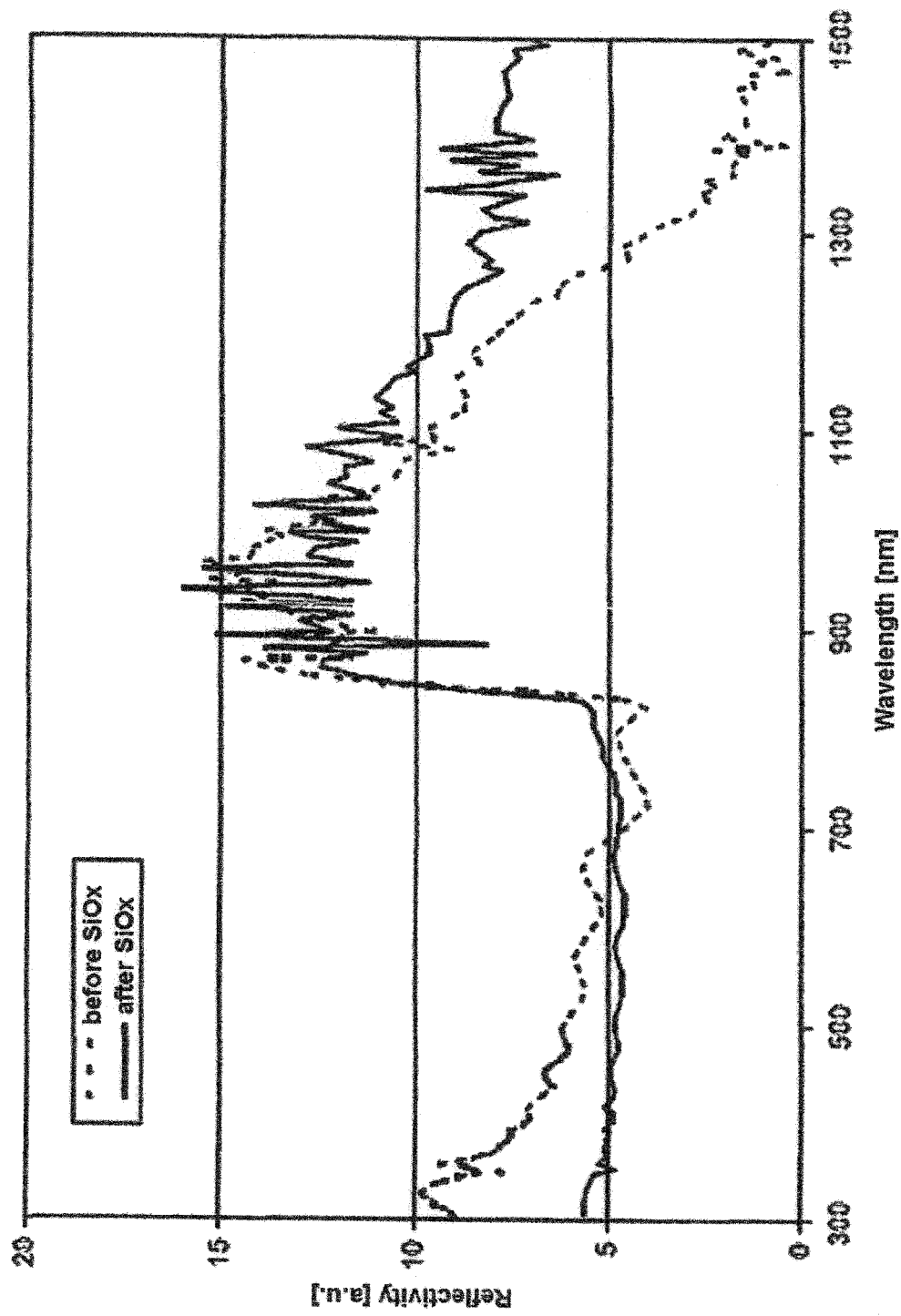
FIG. 2 is a graphical depiction of reflectivity vs. wavelength.

Characteristic features of developments of the inventive solar cell 10 are that:

the photovoltaic layer structure 4 comprises a rear contact 41 composed of molybdenum, an absorber 42 of the composition $CuInSe_2$, $CuInS_2$, $CuGaSe_2$, $CuIn_{1-x}Ga_xSe_2$ where $0 < x \leq 0.5$ or $Cu(InGa)(Se_{1-y}S_y)_2$ where $0 < y \leq 1$, a buffer 43 composed of CdS, a window layer 44 composed of ZnO or ZnO:Al, and a front contact 45 composed of Al or silver;

the substrate 1 consists of a material comprising metal, metal alloys, glass, ceramic or plastic;

the substrate 1 is in the form of a foil, especially in the form of a steel or titanium foil;

the barrier layer 2 consists of a hardened solution of polysilazanes and additives in a solvent which is preferably dibutyl ether;

the barrier layer 2 contains sodium or comprises a sodium-containing precursor layer 21;

the barrier layer 2 has a thickness of 100 to 3000 nm, preferably of 200 to 2500 nm and especially of 300 to 2000 nm;

the barrier layer 2 has a specific volume resistivity measured to DIN IEC 60093 of greater than $1 \cdot 10^9$ MΩ·cm, preferably greater than $1 \cdot 10^{10}$ MΩ·cm and especially greater than $1 \cdot 10^{11}$ MΩ·cm;

the barrier layer 2 on the substrate 1, especially on steel and titanium foil, has an adhesive strength measured to DIN EN ISO 2409 with an adhesive tape width of 20 mm of greater than 5 N, preferably greater than 7 N and especially greater than 10 N;

the solar cell 10 comprises an encapsulation layer 5 which consists of a hardened solution of polysilazanes and additives in a solvent;

the barrier layer 2 and optionally the encapsulation layer 5 have been produced from polysilazanes of the formula I

  (I)

where R', R", R''' are the same or different and are each independently hydrogen or an optionally substituted alkyl, aryl, vinyl or (trialkoxysilyl)alkyl radical, where n is an integer and is such that the polysilazane has a number-average molecular weight of 150 to 150,000 g/mol, preferably of 50,000 to 150,000 g/mol, and especially of 100,000 to 150,000 g/mol;

and at least one polysilazane is selected from the group of the perhydropolysilazanes where R', R" and R'''=H.

The process for producing the inventive solar cells comprises the following steps a) to g):

a) coating a substrate composed of metal, metal alloys, glass, ceramic or plastic with a solution comprising at least one polysilazane of the formula (I)

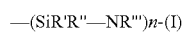

where R', R", R''' are the same or different and are each independently hydrogen or an optionally substituted alkyl, aryl, vinyl or (trialkoxysilyl)alkyl radical, where n is an integer and is such that the polysilazane has a number-average molecular weight of 150 to 150,000 g/mol, preferably of 50,000 to 150,000 g/mol, and especially of 100,000 to 150,000 g/mol, b) removing the solvent by evaporation to obtain a polysilazane layer having a thickness of 100 to 3000 nm, preferably of 200 to 2500 nm and especially of 300 to 2000 nm on the substrate, c) optionally repeating steps a) and b) once or more than once, d) hardening the polysilazane layer by i) heating to a temperature in the range from 20 to 1000° C., especially 80 to 200° C., and/or ii) irradiating with UV light having wavelength components in the range from 180 to 230 nm, the heating and/or irradiation being effected over a period of 1 min to 14 h, preferably 1 min to 60 min and especially 1 min to 30 min, preferably in an atmosphere of water vapor-containing air or nitrogen, e) optionally further hardening the polysilazane layer at a temperature of 20 to 1000° C., preferably 60 to 130° C., in air having a relative humidity of 60 to 90% over a period of 1 min to 2 h, preferably 30 min to 1 h, f) applying a photovoltaic layer structure based on chalcopyrite, and g) optionally applying an encapsulation layer to the photovoltaic layer structure according to steps a) to e).

In advantageous configurations of the process according to the invention, a polysilazane solution used for coating comprises one or more of the following constituents:

at least one perhydropolysilazane where R', R" and R'''=H;
a catalyst, and optionally further additives;
sodium, preferably in the form of sodium acetate or sodium tetraborate.

Alternatively to an addition of sodium compounds to the polysilazane solution, process step d) or optionally e) is followed, i.e. the application of the photovoltaic layer structure in step f) is preceded, by deposition of a sodium-containing precursor layer on the polysilazane layer, preferably by vapor deposition of sodium fluoride.

Preference is given in accordance with the invention to a substrate configured as a flexible web, which enables production of the chalcopyrite solar cells in a roll-to-roll process.

In the polysilazane solutions used to produce the inventive barrier layers, the proportion of polysilazane is 1 to 80% by weight, preferably 2 to 50% by weight and especially 5 to 20% by weight, based on the total weight of the solution.

Suitable solvents are especially organic, preferably aprotic solvents which do not contain any water or any reactive groups such as hydroxyl or amino groups, and are inert toward the polysilazane. Examples are aromatic or aliphatic hydrocarbons and mixtures thereof. Examples include aliphatic or aromatic hydrocarbons, halohydrocarbons, esters such as ethyl acetate or butyl acetate, ketones such as acetone or methyl ethyl ketone, ethers such as tetrahydrofuran or dibutyl ether, and also mono- and polyalkylene glycol dialkyl ethers (glymes) or mixtures of these solvents.

Additional constituents of the polysilazane solution may be catalysts, for example organic amines, acids, and metals or metal salts or mixtures of these compounds which accelerate the layer formation process. Suitable amine catalysts are especially N,N-diethylethanolamine, N,N-dimethylethanolamine, N,N-dimethylpropanolamine, triethylamine, triethanolamine and 3-morpholinopropylamine. The catalysts are used preferably in amounts of 0.001 to 10% by weight, especially 0.01 to 6% by weight, more preferably 0.1 to 5% by weight, based on the weight of the polysilazane.

Further constituents may be additives for substrate wetting and film formation, and also inorganic nanoparticles of oxides such as $SiO_2$, $TiO_2$, ZnO, $ZrO_2$ or $Al_2O_3$.

To produce the inventive barrier layers, a polysilazane solution of the above-described composition is applied by conventional coating processes, for example by means of spray nozzles or a dipping bath, to a substrate, preferably to a steel foil, and optionally smoothed with an elastic coating bar, in order to ensure a homogeneous thickness distribution or material coverage on the substrate. In the case of flexible substrates such as foils of metal or plastic which are suitable for roll-to-roll coating, it is also possible to use slot dies as an application system for the attainment of very thin homogeneous layers. Thereafter, the solvent is evaporated. This can be accomplished at room temperature or, in the case of suitable driers, at higher temperatures, preferably of 40 to 60° C. in the roll-to-roll process at speeds of >1 m/min.

The step sequence of the coating with polysilazane solution followed by evaporation of the solvent is optionally repeated once, twice or more than twice, in order to obtain a dry unhardened ("green") polysilazane layer with a total thickness of 100 to 3000 nm. By repeated passage through the step sequence of coating and drying, the content of solvent in the green polysilazane layer is greatly reduced or eliminated. This measure allows the adhesion of the hardened polysilazane film to be improved on difficult substrates such as steel or titanium foils. A further advantage of repeated coating and drying is that any holes or cracks present in individual layers are substantially covered and closed, such that the number of electrical insulation defects on conductive substrates such as steel or titanium foils is lowered significantly. Electrical insulation defects are caused predominantly by mechanical defects on the surface of the steel or titanium foils, such as rolling grooves or adhering sharp-edged particles which can penetrate a thin (single-ply) polysilazane layer.

The dried or green polysilazane layer is converted to a transparent ceramic phase by hardening at a temperature in the range from 100 to 180° C. over a period of 0.5 to 1 h. The hardening is effected in a convection oven which is operated either with filtered and steam-moistened air or with nitrogen. According to the temperature, duration and oven atmosphere—steam-containing air or nitrogen—the ceramic phase has a different composition. When the hardening is effected, for example, in steam-containing air, a phase of the composition $SiN_vH_wO_xC_y$ where x>v; v<1; 0<x<1.3; 0≤w≤2.5 and y<0.5 is obtained. In the case of hardening in a nitrogen atmosphere, in contrast, a phase of the composition $SiN_vH_wO_xC_y$ where v<1.3; x<0.1; 0≤2.5 and y<0.2 is formed.

The polysilazane layers obtained in such a way have electrical defect densities of less than 0.01 $cm^{-2}$, preferably less than 0.005 $cm^{-2}$, and especially less than 0.002 $cm^{-2}$. In this case, the electrical defect density is determined by applying by vapor deposition or sputtering an aluminum film of thickness 1 to 3 μm to a steel foil (Hamilton SS420 steel) provided with an inventive polysilazane layer. By means of a laser cutting device, ten areas of the aluminum film, each of about 10×10 $cm^2$ in size, are then divided into 100 adjacent square measurement fields which are electrically insulated from one another and each have an area of 1×1 $cm^2$, and the electrical resistance between the steel foil and each of the total of 1000 measurement fields in the aluminum film is determined by means of an ohmmeter. If the resistance measured on a measurement field is less than 100 kΩ, the measurement field in question is considered to be affected by an electrical defect and is rated with a defect density of 1 $cm^{-2}$. By forming the mean over all 1000 measurement fields, the electrical defect density is calculated.

The photovoltaic layer structure based on chalcopyrite is produced by known processes. For this purpose, a rear contact composed of a molybdenum layer of thickness about 1 μm is first deposited by means of DC magnetron sputtering on the inventive barrier layer composed of polysilazane, and preferably structured for a monolithic interconnection (P1 section). The division of the molybdenum layer into strips, which is required for this purpose, is undertaken with a laser cutting device. As discussed at the outset, the efficiency of chalcopyrite solar cells can be increased considerably by monolithic interconnection.

Chalcopyrite absorber layers are conventionally deposited by means of processes such as CVD, PVD and rapid thermal processing (RTP), the temperature of the solar cell assuming values between 450 and 600° C. This may result in isolated instances of delamination between the polysilazane layer and the rear contact composed of molybdenum, or between the rear contact and the chalcopyrite absorber layer. According to the invention, these delaminations caused by thermal stresses are avoided by keeping the temperature of the solar cell within a range from 360 to a maximum of 400° C. during the deposition of the chalcopyrite absorber layer. The absorber layer is preferably prepared in a 3-stage PVD process at a pressure of about $3·10^{-6}$ mbar. The total duration of the PVD process is about 1.5 h, in the course of which the substrates assume a maximum temperature below 400° C.

Thereafter, the delamination can be counteracted by curing the polysilazane layer once more before the deposition of the molybdenum rear contact. This "post-curing" is effected especially at a temperature around 85° C. in air with a relative moisture content of 85% over a period of 1 h. Spectroscopic analyses show that the post-curing significantly lowers the nitrogen content of the polysilazane layer.

The CdS buffer layer is deposited by wet-chemical means at a temperature of about 60° C. The window layer composed of i-ZnO and aluminum-doped ZnO is deposited by means of DC magnetron sputtering.

In a particularly preferred embodiment of the invention, the barrier layer is provided with a sodium depot. Sodium acetate is preferably added to the polysilazane solution used to produce the barrier layer. In a further alternative embodiment, deposition of the molybdenum rear contact is preceded by vapor deposition of a layer of sodium fluoride of thickness 5 to 20 nm on the cured polysilazane layer. The doping with sodium increases the efficiency of the inventive solar cells by more than 60% compared to conventional chalcopyrite reference cells, as shown by the following comparison of test results:

| Substrate | $V_{OC}$ [mV] | $I_{SC}$ [mA] | $J_{SC}$ [mA/$cm^2$] | FF [%] | η [%] |
|---|---|---|---|---|---|
| Steel/Mo (Reference 1) | 420 | 14.6 | 29.2 | 39.7 | 4.9 |
| Steel/Cr/Mo (Reference 2) | 349 | 22.6 | 45.2 | 29.4 | 4.6 |
| Steel/polysilazane + Na*/Mo (inventive) | 468 | 17.7 | 35.4 | 49.7 | 8.3 |

*Sodium acetate

In the above table, $V_{OC}$ denotes the open-circuit voltage, $I_{SC}$ the short-circuit current, $J_{SC}$ the short-circuit current density, FF the fill factor and η the efficiency. The numerical values reported in the table represent the mean of test series each with 8 solar cells, the chalcopyrite absorber layers of all 24 solar cells having been produced by the same process.

The features of the invention disclosed in the above description, in the claims and in the drawings, either individually or in any desired combination, may be essential for the implementation of the invention in its different embodiments.

The invention claimed is:

1. A process for producing a chalcopyrite solar cell, comprising the steps of:
   a) coating a substrate composed of metal, metal alloys, glass ceramic or plastic with a solution comprising at least one polysilazane of the formula (I)

 (I)

where R', R", R'" are the same or different and are hydrogen or an optionally substituted alkyl, aryl, vinyl or (trialkoxysilyl)alkyl radical, where n is an integer and is such that the at least one polysilazane has a number-average molecular weight of 150 to 150,000 g/mol,
   b) removing the solvent by evaporation to obtain a polysilazane layer having a thickness of 100 to 3000 nm, on the substrate,
   c) optionally repeating steps a) and b) once or more than once
   d) hardening the polysilazane layer by i) heating to a temperature in the range from 20 to 1000° C., ii) irradiating with UV light having wavelength components in the range from 10 to 230 nm or both, the heating irradiation or both is effected over a period of 1 min to 14 h,
   e) further hardening the polysilazane layer at a temperature of 20 to 1000° C., in air having a relative humidity of 60 to 90% over a period of 1 min to 2 h,
   f) applying a photovoltaic layer structure based on chalcopyrite, and
   g) applying an encapsulation layer to the photovoltaic layer structure according to steps a) to e).

2. The process as claimed in claim 1, wherein the polysilazane solution comprises at least one perhydropolysilazane where R', R" and R'"=H.

3. The process as claimed in claim 1, wherein the polysilazane solution comprises a catalyst, and optionally further additives.

4. The process as claimed in claim 1, wherein the polysilazane solution contains sodium.

5. The process as claimed in claim 1, wherein step d) or e) is followed by deposition of a sodium-containing precursor layer on the polysilazane layer.

6. The process as claimed in claim 1, wherein the chalcopyrite solar cell is manufactured on a flexible weblike substrate in a roll-to-roll process.

7. The process as claimed in claim 1, wherein the at least one polysilazane has a number-average molecular weight of 50,000 to 150,000 g/mol.

8. The process as claimed in claim 1, wherein the at least one polysilazane has a number-average molecular weight of 100,000 to 150,000 g/mol.

9. The process as claimed in claim 1, wherein the polysilazane layer has a thickness of 200 to 2500 nm.

10. The process as claimed in claim 1, wherein the polysilazane layer has a thickness of 200 to 2500 nm on the substrate.

11. The process as claimed in claim 1, wherein the polysilazane layer has a thickness of 300 to 2000 nm on the substrate.

12. The process as claimed in claim 1, wherein the hardening step of the polysilazane layer takes place at a temperature in the range of 80 to 200° C.

13. The process as claimed in claim 1, wherein the heating, irradiation or both is effected over a period of 1 min to 60 min.

14. The process as claimed in claim 1, wherein the heating, irradiation or both is effected over a period of 1 min to 30 min.

15. The process as claimed in claim 1, wherein the heating, irradiation or both is conducted in an atmosphere of water vapor-containing air or nitrogen.

16. The process as claimed in claim 1, wherein the optionally further hardening of the polysilazane layer takes place at a temperature between 60 and 130° C.

17. The process as claimed in claim 1, wherein the optionally further hardening of the polysilazane layer takes place over a period of 30 min to 1 h.

18. The process as claimed in claim 1, wherein the sodium is in the form of sodium acetate or sodium tetraborate.

19. The process as claimed in claim 5, wherein the deposition of a sodium-containing precursor layer is accomplished by vapor deposition of a sodium fluoride.

* * * * *